(12) United States Patent
Roche et al.

(10) Patent No.: US 7,292,482 B2
(45) Date of Patent: *Nov. 6, 2007

(54) MULTIVIBRATOR PROTECTED AGAINST CURRENT OR VOLTAGE SPIKES

(75) Inventors: Philippe Roche, Le Versoud (FR); François Jacquet, Froges (FR)

(73) Assignee: STMicroelectronics S.A., Montrouge (FR)

( * ) Notice: Subject to any disclaimer, the term of this patent is extended or adjusted under 35 U.S.C. 154(b) by 32 days.

This patent is subject to a terminal disclaimer.

(21) Appl. No.: 11/225,848

(22) Filed: Sep. 12, 2005

(65) Prior Publication Data

US 2006/0056231 A1    Mar. 16, 2006

(30) Foreign Application Priority Data

Sep. 15, 2004   (FR) .................................. 04 09782

(51) Int. Cl.
*G11C 7/00* (2006.01)
*G11C 8/00* (2006.01)

(52) U.S. Cl. .................. 365/189.05; 365/63; 365/154; 365/226

(58) Field of Classification Search ........... 365/189.05, 365/154, 63, 226
See application file for complete search history.

(56) References Cited

U.S. PATENT DOCUMENTS 4,656,368 A * 4/1987 McCombs et al. .......... 327/203
2006/0056231 A1 * 3/2006 Roche et al. ............... 365/156

OTHER PUBLICATIONS

Masatomi Okabe, et al., "Design for Reducing Alpha-Particle-Induced Soft Errors in ECL Logic Circuitry," IEEE Journal of Solid-State Circuits, IEEE Inc. New York, US, Oct. 1, 1989, pp. 1397-1403, XP000066351, ISSN: 0018-9200.

Tsuda, N., "Dual and fail-safe redundancy for static mask-ROMSs and PLAs," Wafer Scale Integration, 1993, International Conference in San Francisco, CA, USA Jan. 20-22, 1993, New York, NY, USA, IEEE, US, Jan. 20, 1993 pp. 57-66, XP010067727, ISBN: 0-7803-0867-0.

* cited by examiner

*Primary Examiner*—Son Dinh
(74) *Attorney, Agent, or Firm*—Gardere Wynne Sewell LLP

(57) ABSTRACT

A multivibrator circuit includes a first data transfer port that receives, as input, multivibrator input data, a first, master, latch cell connected on the output side of the first transfer port, a second, slave, latch cell, and a second data transfer port placed between the first and second latch cells, each latch cell comprising a set of redundant data storage nodes. The transfer ports each include circuitry for writing data separately into each storage node.

20 Claims, 5 Drawing Sheets

MULTIVIBRATOR PROTECTED AGAINST CURRENT OR VOLTAGE SPIKES

PRIORITY CLAIM

The present application claims priority from French Application for Patent No. 04 09782 filed Sep. 15, 2004, the disclosure of which is hereby incorporated by reference.

BACKGROUND OF THE INVENTION

1. Technical Field of the Invention

The present invention relates to multivibrators protected against current or voltage spikes, particularly multivibrators of the flip flop type. However, the invention applies in general to any type of multivibrator protected against such current or voltage spikes.

2. Description of Related Art

The progressive and continuous miniaturization of electronic circuits makes it possible to obtain circuits that continue to increase in performance while continuing to decrease in size. On the down side, such circuits are increasingly sensitive to their external environment, and in particular to logic upsets due to an influx of energy coming from outside the circuit.

A logic upset is a point state change or a transient state, resulting from a voltage spike and/or a current spike at a point in an integrated circuit. By definition, an upset is not predictable or is very unlikely to be predicted.

Logic upsets may have different origins.

A logic upset is, for example, induced by the impact of an energetic charged particle at a point in an integrated circuit. Such an upset is known as a single event upset or SEU. This type of upset appears in integrated circuits used for space applications, because of the radiation encountered beyond the atmospheric and magnetospheric layers that protect the earth. This type of upset is also becoming more frequent in integrated circuits for terrestrial applications, especially in the finest technologies, such as 0.25 micron, 0.18 micron, 0.12 micron and even finer technologies.

A logic upset may also be induced by capacitive coupling at discrete points between two layers of the same integrated circuit. Such an upset is in this case often referred to as a "glitch".

An upset, whatever its origin, is generally manifested by a voltage and/or current spike on a digital or analog signal at a disturbed point in a circuit, formed by the point of impact of the energetic particle in the case of an SEU upset.

If the equivalent capacitance of the circuit downstream of the disturbed point is denoted by C, the change in voltage $\Delta V$ at the disturbed point in question can be written as $\Delta V = \Delta Q/C$, $\Delta Q$ being the change in charge resulting from the impact. The change in voltage $\Delta V$ generally has a very short duration, for example very much less than the period of a clock signal driving the circuit.

An upset may have relatively serious consequences on the downstream circuit that it disturbs.

For example, for a downstream circuit using only logic signals, if the change in voltage $\Delta V$ is low enough not to cause a change in state, the disturbance disappears in quite a short time, with no consequence for the downstream circuit. This is especially the case when the equivalent downstream capacitance is high or when the change in charge $\Delta Q$ is small.

In contrast, if the change in voltage $\Delta V$ is higher, and especially if it is high enough to modify the value of a logic signal, then the consequences may be substantial.

In particular, a change in voltage $\Delta V$ generated by an upset may disturb the normal operation of a flip flop multivibrator.

Specifically, such a multivibrator generally includes two latch cells, called the master cell and the slave cell, each connected to the output of a transfer port.

When an active edge of a clock signal is received by the multivibrator, input data is firstly stored in the master latch cell. The data is transmitted to the second, slave, latch cell and into the output of the multivibrator when an active edge of the clock signal is applied to the second data transfer port. Thus, when the multivibrator receives an active edge of the clock pulse, it reproduces, over the period of the clock signal, on its output, the signal that it receives on its data input.

Now, an upset of substantial amplitude may cause the logic levels present on the input of each latch cell to switch when they are not imposed by a corresponding transfer port.

Such switching, that is to say the modification of the content of the latch cells, will, of course, have the consequence of introducing an error into the output from the multivibrator.

For the purpose of protecting the multivibrators against upsets and thus preventing any disturbance of the downstream circuit, it has been proposed to produce each latch cell in a redundant manner, that is to say in the form of a set of redundant data storage nodes, so that when an upset causes an alteration in the logic level stored in one of the nodes, the initial information may be restored from the information stored in a complementary node.

A need, however, exists to further improve the protection of multivibrators against current or voltage spikes.

SUMMARY OF THE INVENTION

Embodiments of the present invention comprise a multivibrator protected against current or voltage spikes. A first data transfer port receives, as input, multivibrator input data. A first, master, latch cell is connected on the output side of the first transfer port. A second, slave, latch cell is provided such that a second data transfer port is placed between the first and second latch cells. Each latch cell comprises a set of redundant data storage nodes.

According to an embodiment of the invention, the transfer ports each comprise means for writing data separately into each storage node.

This avoids simultaneously writing erroneous information into the set of storage nodes in the event of an upset occurring immediately upon input into a latch cell.

In one embodiment, each latch cell comprises four storage nodes and the transfer ports each comprise four separate write circuits for writing the data into the four nodes, respectively.

In this case, for example, each write circuit comprises a first n type MOS transistor, the gate of which is intended to receive data coming from a data storage node of the first latch cell and the drain of which is connected to the source of a second n type MOS transistor, the gate of which receives a clock signal and the drain of which is used to write the data into a storage node of the second latch cell.

The multivibrator may furthermore include an input circuit suitable for generating redundant data for the latch cell. Thus, the protection of the multivibrator against upsets is further improved.

For example, this input circuit comprises an inverter circuit for inverting input data, the output of which is intended to be written into storage nodes.

According to another feature of the invention, the multivibrator furthermore includes an output circuit protected against current or voltage spikes and placed on the output side of the second data storage cell.

For example, this output circuit comprises two stages, one for transferring data in the high state and the other for transferring data in the low state.

In one embodiment, the stage for transferring data in the low state comprises a first p type MOS transistor, the gate of which receives data in the low state and the source of which is connected to a DC supply, and a second p type MOS transistor, the source of which is connected to the drain of the first MOS transistor, the gate of which receives data in the low state and the drain of which delivers data as output from the multivibrator.

As regards the stage for transferring data in the high state, this comprises a first n type MOS transistor, the gate of which receives data in the high state and the drain of which is connected to the drain of the second p type MOS transistor and delivers data as output from the multivibrator, a second n type MOS transistor, the drain of which is connected to the source of the first n type MOS transistor, the gate of which receives data in the high state and the source of which is connected to ground/earth.

An embodiment of the invention comprises a multivibrator including a master latch cell and a slave latch cell coupled to the master latch cell. Each of those latch cells comprises a pair of true data storage nodes and a pair of false data storage nodes. The true data storage nodes are separated by a distance that is greater than a diameter of an ionized particle capable of generating a current or voltage spike in the cell, and the false storage nodes are separated by a distance that is greater than a diameter of an ionized particle capable of generating a current or voltage spike in the cell.

An embodiment of the invention comprises a multivibrator including a master latch cell and a slave latch cell coupled to the master latch cell. Each of those latch cells comprises a pair of true data storage nodes at the drain terminals of first and second transistors and a pair of false data storage nodes at the drain terminals of third and fourth transistors. The first and second transistors for the true data storage nodes are implanted in different wells of a first conductivity type, and the third and fourth transistors for the false data storage nodes are implanted in different wells of the first conductivity type.

An embodiment of the invention comprises an integrated circuit multivibrator including a semiconductor substrate including a region for a master and slave latches of the multivibrator. A plurality of transistors are formed in a center area of the region. The circuit includes first and second transistors associated with a pair of true data storage nodes for each of the master and slave latches, and third and fourth transistors associated with a pair of false data storage nodes for each of the master and slave latches. The first and second transistors for each latch are formed in the region on opposite sides of the center area and the third and fourth transistors for each latch are formed in the region on opposite sides of the center area.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
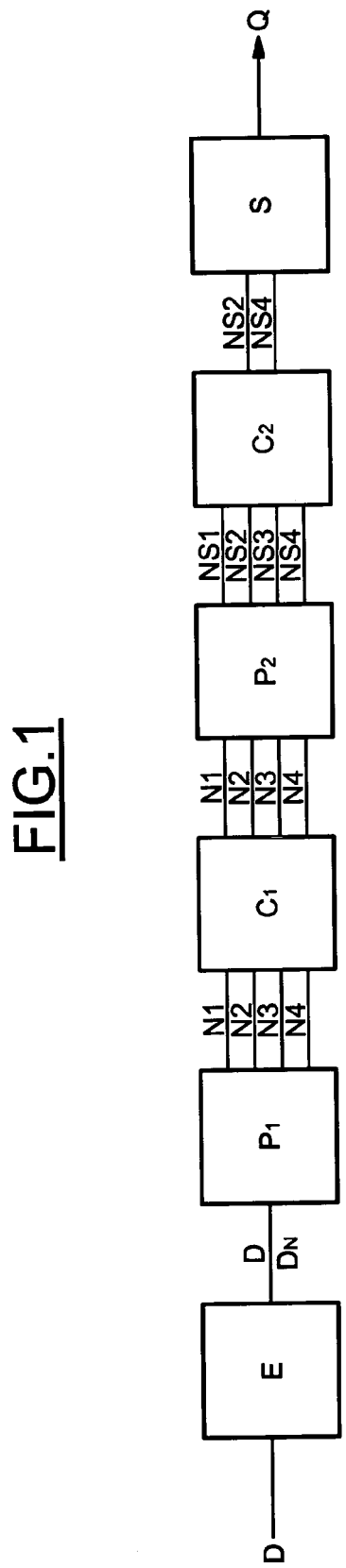
FIG. 1 is an electronic diagram illustrating the structure of a flip flop multivibrator according to the invention.

FIG. 1 shows the overall architecture of an example of an electronic diagram of a multivibrator of the flip flop type protected against current or voltage spikes.

As may be seen in FIG. 1, such a multivibrator comprises: a first data transfer port P1 receiving, as input, data D and $D_N$ (true and false) coming from an input circuit E; a first, master, data latch cell $C_1$, used for temporarily storing the data coming from the transfer point $P_1$; a second data latch cell $C_2$, constituting a slave latch cell, into which the data coming from the first, master cell $C_1$ is transferred; a second data transfer port $P_2$; and an output circuit S.

Figure 2:
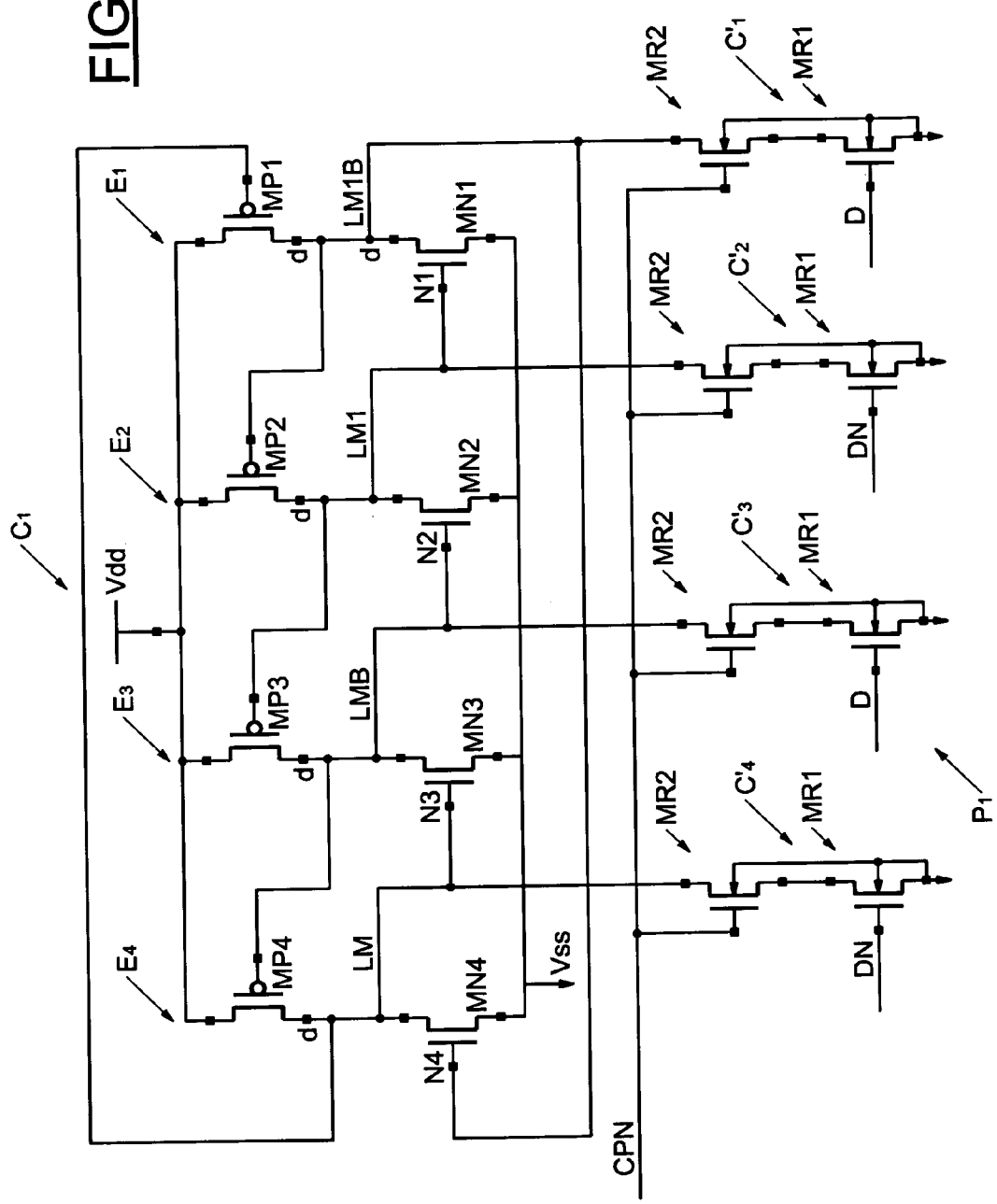
FIG. 2 illustrates the structure of the first latch cell and the corresponding transfer port.

As may be seen in FIG. 2, each master data latch cell comprises four sets of transistors $E_1$, $E_2$, $E_3$ and $E_4$ used for controlling the voltage level of four respective data storage nodes N1, N2, N3 and N4. Likewise, as may be seen in FIG. 3, each slave data latch cell comprises four sets of transistors $E_1$, $E_2$, $E_3$ and $E_4$ used for controlling the voltage level of four respective data storage nodes NS1, NS2, NS3 and NS4.

Each set of transistors comprises a p type MOS transistor and an n type MOS transistor. Thus, each latch cell $C_1$ or $C_2$ comprises four p type MOS transistors, namely MP1, MP2, MP3 and MP4, and four n type MOS transistors, namely MN1, MN2, MN3 and MN4.

The source of each of the transistors MP1, MP2, MP3 and MP4 is connected to a DC voltage source Vdd, for example equal to 1.2 volts, and the source of the transistors MN1, MN2, MN3 and MN4 is connected to an earthing (grounding) circuit Vss. The drain d of each p type MOS transistor of the set i of transistors $E_i$ (i=1, 2, 3, 4) is connected to the drain of the corresponding n type MOS transistor MNi.

As regards the sets of transistors $E_1$, $E_2$, $E_3$ and $E_4$ of the master cell (FIG. 2), the node between the p type transistors and the n type transistors, called N4, N1, N2 and N3 respectively, are connected to the gate of the p type MOS transistors of the sets $E_2$, $E_3$, $E_4$ and $E_1$ and to the gates of the n type MOS transistors of the sets $E_4$, $E_1$, $E_2$ and $E_3$, respectively.

Figure 3:
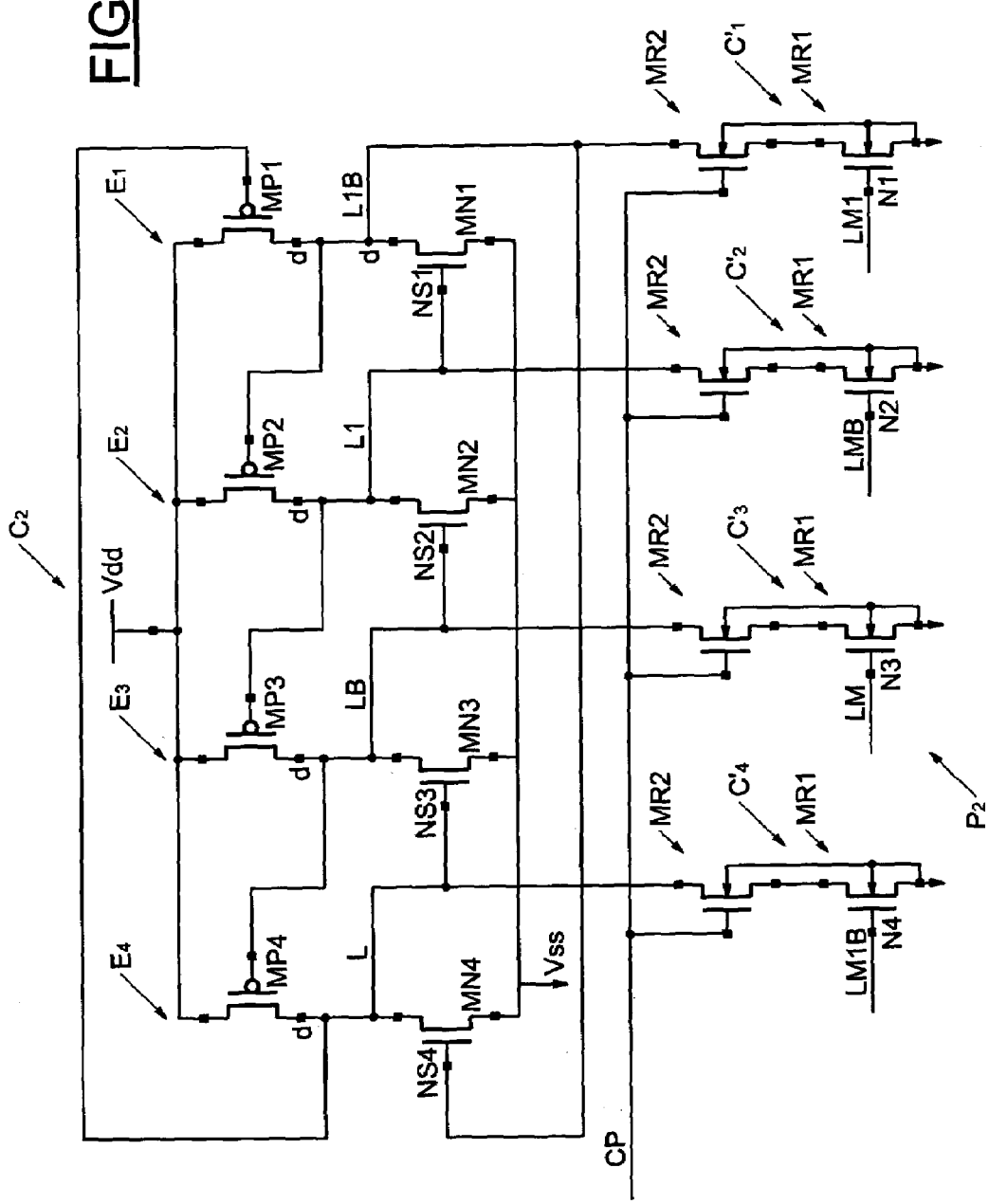
FIG. 3 illustrates the structure of the second latch port and the corresponding transfer port.

The slave cell is designed in an identical manner (see FIG. 3). The nodes between the p type transistors and the n type transistors of the sets of transistors $E_1$, $E_2$, $E_3$ and $E_4$, denoted by NS4, NS1, NS2 and NS3 respectively, are connected to the gates of the p type MOS transistors MP2, MP3, MP4 and MP1 and to the gates of the n type MOS transistors MN4, MN1, MN2 and MN3, respectively.

The nodes N1, N2, N3 and N4, on the one hand, and NS1, NS2, NS3 and NS4, on the other, used for storing logic information, constitute redundant storage nodes and are connected to the gate of the n type MOS transistors MN1, MN2, MN3 and MN4, respectively.

As may be seen in FIGS. 2 and 3, access to the nodes N1, N2, N3, N4 and NS1, NS2, NS3, NS4 of the master and slave latch cells, respectively, takes place via the data transfer ports $P_1$ and $P_2$, which comprise four access circuits that correspond to four write circuits for four sets of data coming from the input circuit E and from the first latch cell, respectively.

Preferably, in the master cell, true data D is written into the nodes N1 and N3 and the complement/false $D_N$ of this data is written into the nodes N2 and N4.

The data coming from the nodes N4 (or LM1B), N1 (or LM1), N2 (or LMB) and N3 (or LM), in the nodes NS4, NS1, NS2 and NS3 respectively, are written into the slave cell.

The transfer ports $P_1$ and $P_2$ are thus each formed from a combination of four write circuits $C'_1$, $C'_2$, $C'_3$ and $C'_4$.

Each write circuit comprises a first n type MOS transistor MR1 and a second n type MOS transistor MR2. The gate of each transistor MR1 receives data D or $D_N$ to be written, or data coming from a node of the master cell, and the source of this transistor MR1 is connected to earth/ground. The gate of the second transistor MR2 receives a clock signal CPN or CP delivered by an appropriate circuit and the source of each transistor MR2 is connected to the drain of a corresponding transistor MR1. Finally, the drain of each transistor MR2 is connected to a corresponding data storage node.

As regards the second data transfer port $P_2$, the transistors MR2 are controlled by a complementary clock signal CP of the clock signal CPN controlling the first port $P_1$.

Figure 4:
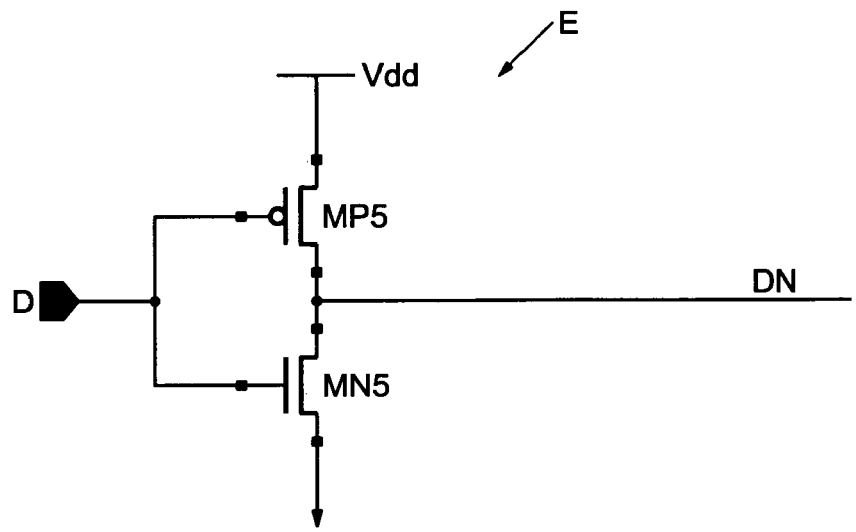
FIG. 4 is an electronic diagram of the input circuit.

As shown in FIG. 4, the input circuit E is intended to generate redundant data for the first data transfer port $P_1$. It comprises an inverter circuit that delivers inverted data $D_N$. The inverter circuit comprises a p type MOS transistor MP5, the source of which is connected to a DC supply voltage Vdd and an n type MOS transistor MN5, the drain of which is connected to the drain of the transistor MP5 and the source of which is connected to earth/ground. The gates of the two transistors MP5 and MN5 are connected and received, as input, data D, whereas the common drain between the transistors MP5 and MN5 delivers the inverted input data $D_N$.

Figure 5:
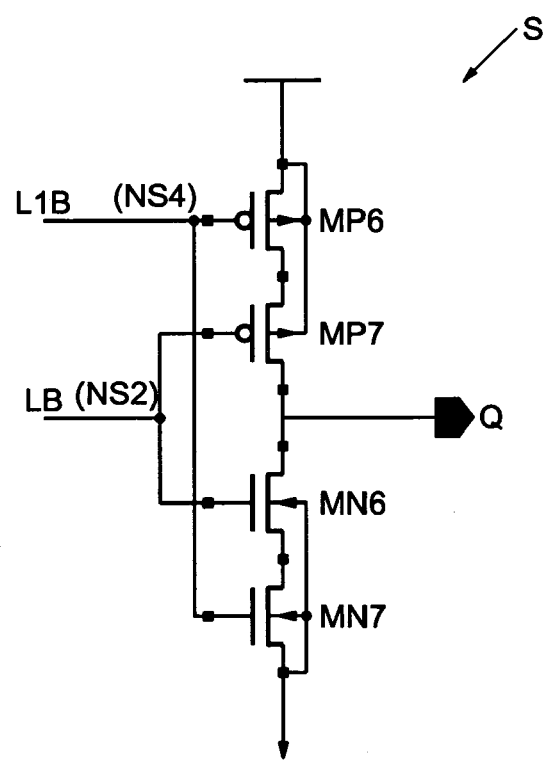
FIG. 5 is an electronic diagram of the output circuit.

Finally, the output circuit S illustrated in FIG. 5 constitutes an output stage protected against current or voltage spikes and receives data coming from the nodes of the second latch cell. This output circuit S comprises two stages, one for transferring data in the high state and the other for transferring data in the low state.

The stage for transferring data in the low state comprises a first p type MOS transistor MP6 and a second p type MOS transistor MP7. The source of the first transistor MP6 is connected to a supply voltage and the drain of this transistor is connected to the source of the transistor MP7. The gate of the transistor MP6 receives data L1B (or NS4) in the low state, whereas the gate of the transistor MP7 receives data LB (or NS2) in the low state.

As regards the stage for transferring data in the high state, this stage comprises a first n type MOS transistor MN6 and a second n type MOS transistor MN7.

The drain of the transistor MN6 is connected to the drain of the transistor MP7, whereas the source of this transistor MN6 is connected to the drain of the transistor MN7, the source of which is connected to earth/ground. The gate of the transistor MN6 receives the input data in the high state, whereas the gate of the transistor MN7 receives data in the high state. The common node between the drain of the transistor MP7 and the drain of the transistor MN6 delivers the output Q of the multivibrator.

The circuit as described with reference to FIGS. 1 to 5 operates as follows.

When an active edge of the clock signal CPN arrives, that is to say when the clock signal CPN switches to the high level, the first port $P_1$ is conducting and the first, master latch cell $C_1$ is active. In contrast, when the signal CP switches to the low level, the second port $P_2$ is blocked and the second latch cell $C_2$ is inactive. The data presented at the input of the first transfer port $P_1$ is transferred to the first, master latch cell $C_1$, the transistors MR2 of this port $P_1$ being in the on state. The logic level stored in the nodes N1, N2, N3 and N4 then depends on the logic level of the incident data D and $D_N$.

As soon as an active (rising) edge appears on the clock signal CP, that is to say when the signal CPN switches to the low level, the port $P_1$ is blocked and the port $P_2$ becomes conducting. The data coming from the storage nodes of the first master cell is then transferred to the corresponding nodes of the second, slave cell $C_2$, to be available on the output Q of the multivibrator, as long as the signal CP remains at the high level, whereas the first latch cell $C_1$ is isolated.

As will be explained below, the arrangement that has just been described provides effective protection against current and/or voltage upsets.

Firstly, the information in the latch cells is stored in a redundant manner in pairs of complementary nodes. Thus, any degradation of the information stored in one node of one of the pairs may be restored from the information stored in the other node.

For example, the "1", "0", "1" and "0" data is stored in the nodes N1, N2, N3 and N4, respectively. If a disturbance appears on the node N1, as a result of a transient spike of negative voltage, the corresponding drop in voltage on the gate of the transistor MN1 causes this transistor to be turned off. In contrast, this disturbance causes the p type MOS transistor MP3 to conduct. However, the voltage of the node N2 is maintained at 0 by the transistor MN3. The transistor MP4 is therefore kept in the on state, so that the transistor MP1 remains in the off state and the voltage on the node N4 is not altered. Likewise, the logic level stored in the node N3 is not modified.

At the same time, the logic level of the node N1 is restored by means of the transistor MP2.

The arrangement that has just been described allows a logic level stored in a node to be restored after a disturbance generated by an upset.

Furthermore, by using transfer ports provided with specific access circuits used for writing data into the respective nodes N1, N2, N3 and N4, a disturbance is prevented from being simultaneously transmitted to all of the nodes. Thus, for example, if only one of the nodes is corrupted in the master latch cell, only one of the corresponding nodes will be temporarily disturbed. However, it may be restored to its initial state, as described above.

Furthermore, by using the output circuit which comprises two stages for transferring the data in the high state and in the low state, respectively, when one of the inputs of this stage is temporarily modified, the output becomes a high impedance output and is therefore capacitively maintained at its initial value, so that the output is not disturbed.

To further improve the protection of the multivibrator against upsets, and in particular to prevent an upset from being able simultaneously to alter two complementary nodes in which the same information is stored in a redundant manner, the nodes of each pair opposite each other are implanted in a region of a substrate defining the multivibrator.

Figure 6:
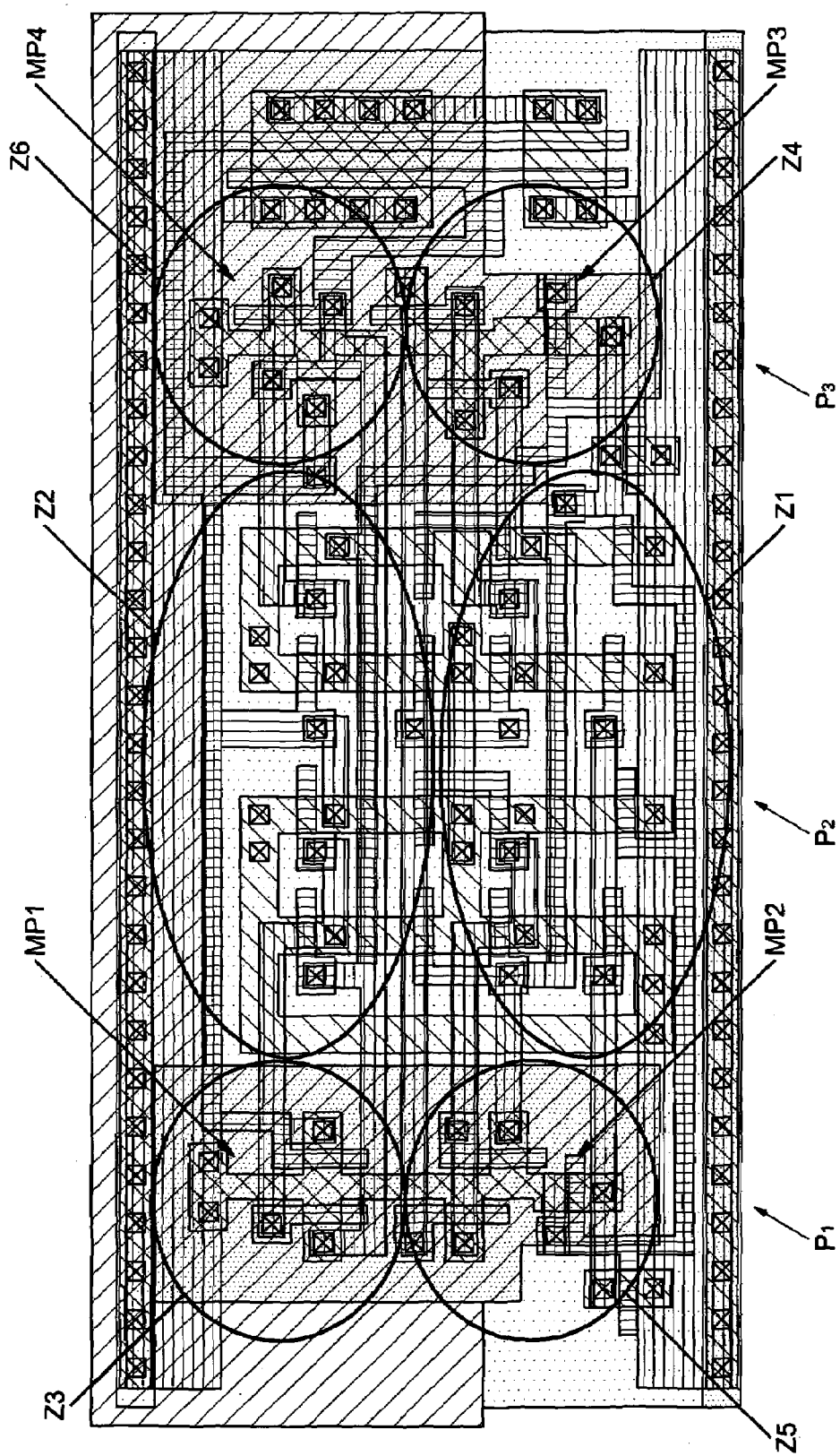
FIG. 6 illustrates an example of implementation of the multivibrator of FIG. 1 according to the invention.

FIG. 6 shows the layers of a material deposited on a semiconductor substrate for producing the various elements of the circuit of FIG. 1. The technique for producing these elements lies within the scope of a person skilled in the art and will therefore not be described in detail below.

However, it should be noted that the various transistors used for producing the multivibrator are formed in three isolated wells, namely an n type first well $P_1$ or $N_{well}$, a p type second well $P_2$ or $P_{well}$ and an n type third well $P_3$ or $N_{well}$.

The nMOS transistors MN1, MN2, MN3 and MN4 of the master latch cell are placed in a first zone Z1 of the p type central well $P_2$, while the nMOS transistors MN1, MN2, MN3 and MN4 of the slave cell $C_2$ are placed in a second zone Z2 of the central well $P_2$.

In contrast, the pMOS transistors MP1, MP2, MP3 and MP4 of each master or slave cell are distributed over the two n type wells $P_1$ and $P_3$ in such a way that the two data storage nodes of each pair are placed opposite each other, that is to say on either side of the central well $P_2$.

For example, the transistor MP1 is implanted in a first zone Z3 of the first well $P_1$ and the transistor MP3 in a zone Z4 of the third well $P_3$ placed opposite the first zone Z3.

Likewise, the transistor MP2 is implanted in a second zone Z5 of the first well $P_1$ placed in the vicinity of the first zone Z3 and the transistor MP4 in a second zone Z6 of the third well $P_3$ extending near the first zone Z4.

Thus, thanks to this arrangement, the node N1 is as far away as possible from the node N3, and the node N2 is also as far away as possible from the node N4.

For example, these transistors are at a distance of at least 1 micron apart, so as to prevent an ionized particle, the diameter of which is typically around 0.6 microns, which has disturbed one of these transistors, from disturbing the other transistor, even though shorter distances could also be envisaged.

Thus, an ionized particle is prevented from simultaneously disturbing the nodes N1 and N3, on the one hand, and the nodes N2 and N4 on the other.

Furthermore, by producing the transistors MP1, MP2, MP3 and MP4 in two n type wells separated by a p type well in which the n type transistors are implanted, each pair of redundant data storage nodes is isolated thanks to the formation of a junction between the wells.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

what is claimed is:

1. A multivibrator protected against current or voltage spikes, comprising:
    a first data transfer port that receives, as input, multivibrator input data;
    a first, master, latch cell connected on the output side of the first transfer port;
    a second, slave, latch cell; and
    a second data transfer port placed between the first and second latch cells;
    wherein each latch cell comprises a set of redundant data storage nodes and wherein the transfer ports each comprise means for writing data separately into each storage node.

2. The multivibrator according to claim 1, wherein each latch cell comprises four storage nodes and wherein the transfer ports each comprise four separate write circuits for writing the data into the four storage nodes, respectively.

3. The multivibrator according to claim 2, wherein each write circuit comprises a first n type MOS transistor, the gate of which receives data coming from a data storage node of the first latch cell and the drain of which is connected to the source of a second n type MOS transistor, the gate of which receives a clock signal and the drain of which is used to write the data into a storage node of the second latch cell.

4. The multivibrator according to claim 1, further comprising an input circuit suitable for generating redundant data for the first latch cell.

5. The multivibrator according to claim 4, wherein the input circuit comprises an inverter circuit for inverting input data, the output of which is intended to be written into data storage nodes.

6. The multivibrator according to claim 1, further comprising an output circuit protected against current or voltage spikes and placed on the output side of the second data storage cell.

7. The multivibrator according to claim 6, wherein the output circuit comprises two stages, one for transferring data in the high state and the other for transferring data in the low state.

8. The multivibrator according to claim 7, wherein the stage for transferring data in the low state comprises a first p type MOS transistor, the gate of which receives data in the low state and the source of which is connected to a DC supply, and a second p type MOS transistor, the source of which is connected to the drain of the first MOS transistor, the gate of which receives data in the low state and the drain of which delivers data as output from the multivibrator.

9. The multivibrator according to claim 8, wherein the stage for transferring data in the high state comprises a first n type MOS transistor, the gate of which receives data in the high state and the drain of which is connected to the drain of the second p type MOS transistor and delivers data as output from the multivibrator, and a second n type MOS transistor, the drain of which is connected to the source of the first n type MOS transistor, the gate of which receives data in the high state and the source of which is connected to earth/ground.

10. A multivibrator, comprising:
    a master latch cell; and
    a slave latch cell coupled to the master latch cell;
    wherein, each latch cell comprises:
        a pair of true data storage nodes;
        a pair of false data storage nodes;
        wherein the true data storage nodes are separated by a distance that is greater than a diameter of an ionized particle capable of generating a current or voltage spike in the cell, and
        wherein the false storage nodes are separated by a distance that is greater than a diameter of an ionized particle capable of generating a current or voltage spike in the cell.

11. The multivibrator of claim 10 wherein the distance of separation is greater than one micron.

12. A multivibrator, comprising:
    a master latch cell; and
    a slave latch cell coupled to the master latch cell;
    wherein, each latch cell comprises:
        a pair of true data storage nodes at the drain terminals of first and second transistors;
        a pair of false data storage nodes at the drain terminals of third and fourth transistors;
        wherein the first and second transistors for the true data storage nodes are implanted in different wells of a first conductivity type, and wherein the third and fourth transistors for the false data storage nodes are implanted in different wells of the first conductivity type.

13. The multivibrator of claim 12,
wherein the true data storage nodes are separated by a distance that is greater than a diameter of an ionized particle capable of generating a current or voltage spike in the cell, and
wherein the false data storage nodes are separated by a distance that is greater than a diameter of an ionized particle capable of generating a current or voltage spike in the cell.

14. The multivibrator of claim 12 wherein the true data storage nodes are separated from each other, as well as the false data storage nodes are separated from each other, by a distance of at least one micron.

15. The multivibrator of claim 12 wherein the first and third transistors are implanted in a first well of the first conductivity type and the second and fourth transistors are implanted in a second well of the first conductivity type, the cell further including at least one additional transistor implanted in a well of a second conductivity type, wherein the well of the second conductivity type is positioned between the first and second wells of the first conductivity type.

16. An integrated circuit multivibrator comprising:
a semiconductor substrate including a region for a master and slave latches of the multivibrator;
a plurality of transistors formed in a center area of the region;
first and second transistors associated with a pair of true data storage nodes for each of the master and slave latches;
third and fourth transistors associated with a pair of false data storage nodes for each of the master and slave latches;
wherein the first and second transistors for each latch are formed in the region on opposite sides of the center area and wherein the third and fourth transistors for each latch are formed in the region on opposite sides of the center area.

17. The circuit of claim 16 wherein first and second transistors are separated by a distance and the third and fourth transistors are separated by distance each greater than a diameter of an ionized particle capable of generating a current or voltage spike in the cell.

18. The circuit of claim 16 wherein first and second transistors are separated by a distance and the third and fourth transistors are separated by distance each of at least one micron.

19. The circuit of claim 16 wherein the first and third transistors are formed in a first well of a first conductivity type and the second and fourth transistors are formed in a second well also of the first conductivity type, and wherein the center area of the region comprises a well of a second conductivity type in which the plurality of transistors are implanted.

20. The circuit of claim 19 wherein the first conductivity type is n-type and the second conductivity type is p-type.

* * * * *